US010648700B2

(12) United States Patent
Citron (10) Patent No.: US 10,648,700 B2
(45) Date of Patent: May 12, 2020

(54) TROUGH SHAPED FRESNEL REFLECTOR SOLAR CONCENTRATOR

(71) Applicant: Jeffrey Michael Citron, Tucson, AZ (US)

(72) Inventor: Jeffrey Michael Citron, Tucson, AZ (US)

( * ) Notice: Subject to any disclaimer, the term of this patent is extended or adjusted under 35 U.S.C. 154(b) by 0 days.

(21) Appl. No.: 15/909,850

(22) Filed: Mar. 1, 2018

(65) Prior Publication Data

US 2018/0187925 A1    Jul. 5, 2018

Related U.S. Application Data

(63) Continuation-in-part of application No. 14/162,320, filed on Jan. 23, 2014, now Pat. No. 9,941,436, which (Continued)

(51) Int. Cl.
*F24S 30/425*     (2018.01)
*H01L 31/054*     (2014.01)
(Continued)

(52) U.S. Cl.
CPC .............. *F24S 30/425* (2018.05); *F24S 10/74* (2018.05); *F24S 20/20* (2018.05); *F24S 23/80* (2018.05); *F24S 70/60* (2018.05); *H01L 31/0547* (2014.12); *H02S 40/44* (2014.12); *F24S 70/65* (2018.05); *F24S 2010/71* (2018.05); *F24S 2023/834* (2018.05); *F24S 2023/84* (2018.05); *F24S 2023/872* (2018.05); *F24S 2030/115* (2018.05); *Y02E 10/44* (2013.01); *Y02E 10/52* (2013.01)

(58) Field of Classification Search
CPC ....... F24J 2002/10004; F24J 2002/1009; F24J 2002/1014; F24J 2002/1019; F24J 2002/1023; F24J 2002/1028; F24J 2002/1033; F24J 2002/1038; F24J 2002/108; F24J 2002/1076; F24J 2/12; Y02E 10/45; H01L 31/0547; H01L 31/054; F24S 10/70–72
See application file for complete search history.

(56) References Cited

U.S. PATENT DOCUMENTS 4,800,868 A * 1/1989 Appeldorn .............. F24S 23/80
126/692
2011/0017273 A1* 1/2011 Roach ................. F24D 11/0221
136/246

(Continued)

*Primary Examiner* — Daniel P Malley, Jr.
(74) *Attorney, Agent, or Firm* — US IP Attorneys, P.C.; Timothy Marc Shropshire (57) ABSTRACT

The present invention is a solar concentrator composed of a generally V-shaped trough of reflective Fresnel steps. The Fresnel reflective steps concentrate the sunlight entering the mouth of the V-shaped trough and parallel to its central axis into a central focal area. By disposing a solar energy receiving element at the central focal area of sunlight concentration a preferred embodiment as a concentrating solar energy collector is realized. Various types of solar energy receiving structures are shown that serve to convert the concentrated sunlight into other forms of useful energy to realize the preferred embodiment as a concentrating solar energy collector.

7 Claims, 6 Drawing Sheets

Related U.S. Application Data is a continuation-in-part of application No. 13/337,206, filed on Dec. 26, 2011, now abandoned.

(60) Provisional application No. 61/427,433, filed on Dec. 27, 2010.

(51) Int. Cl.
*F24S 23/70* (2018.01)
*F24S 10/70* (2018.01)
*H02S 40/44* (2014.01)
*F24S 70/60* (2018.01)
*F24S 20/20* (2018.01)
*F24S 30/00* (2018.01)
*F24S 70/65* (2018.01)

(56) References Cited

U.S. PATENT DOCUMENTS

| | | | |
|---|---|---|---|
| 2013/0008488 A1* | 1/2013 | Holmes | H01L 31/0521 136/248 |
| 2014/0048121 A1* | 2/2014 | Schwartz | H01L 31/0547 136/248 |

* cited by examiner

TROUGH SHAPED FRESNEL REFLECTOR SOLAR CONCENTRATOR

CROSS-REFERENCE TO RELATED APPLICATION(S)

The present application is a continuation-in-part of, and claims priority to, U.S. Non-provisional application Ser. No. 14/162,320 filed on Jan. 23, 2014, entitled "COMPOUND LINEAR V FRESNEL-PARABOLIC TROUGH SOLAR CONCENTRATOR", which application is a continuation-in-part of, and claims priority to, U.S. Non-provisional application Ser. No. 13/337,206 filed on Dec. 26, 2011, entitled "TROUGH SHAPED FRESNEL REFLECTOR SOLAR CONCENTRATOR", which application claims benefit of U.S. Provisional Application No. 61/427,433 filed on Dec. 27, 2010, entitled "TROUGH SHAPED FRESNEL REFLECTOR SOLAR CONCENTRATOR", the entire disclosures of which are incorporated by reference herein.

BACKGROUND OF THE INVENTION

1. Field of Invention

The present invention is in the field of solar concentrators. More particularly the present invention is shown in the configuration of a solar collector whose purpose is to concentrate solar energy and convert it into other useful forms of energy, although this is not intended to limit its use to that purpose.

2. Description of Related Art

Prior art trough shaped concentrators have incorporated complex design elements that make them expensive to manufacture and install in the field. These design elements include curved mirrors that are expensive to make. Other designs include underlying curved geometric configurations of mirrors that require complex support structures. Still other designs show extreme multifaceted mirror configurations. The present invention is designed to simplify design elements to reduce the cost of manufacturing.

SUMMARY OF THE INVENTION

The present invention is a solar energy concentrator. More particularly it is shown in the preferred embodiment of a solar energy collector. As a solar energy collector, it encompasses the solar energy concentrator of the present invention and a receiver element for receiving the concentrated solar energy and converting it to another form of energy. The present invention is comprised of a solar concentrator made of multiple flat linear reflective surfaces in the general shape of a linear trough that reflect and concentrate the solar energy to an area located on the central line of the trough. More particularly the flat linear reflective surfaces collectively, effectively comprise a Fresnel reflector concentrating the solar energy along the width of line focal area of the Fresnel reflector. The Fresnel reflector of the present invention effectively forms steps along an underlying V shaped trough structure of the present concentrator. In one preferred embodiment by putting a solar energy receiving element at the line focal area of the trough shaped Fresnel reflector a solar energy collector is created. In this embodiment each reflector fully illuminates the receiver element. This combination of a generally trough shaped concentrator having an underlying V shaped structure with fixed flat Fresnel reflectors whose axis of concentration is on the center line of the trough shaped concentrator itself is the new and unique combination of the present invention.

A major advantage of the present invention is that if made from individual component materials (reflectors and structural support components) because the design is completely linear, those materials may be sourced from common off-the-shelf materials. Another advantage of the present invention compared to curved trough concentrators is that its' flat linear structure is easily amenable to inexpensive manufacture by being stamped from metallic materials of various gauges. Also it can easily be installed in a protective housing to shield it from environmental factors such as wind loading and hail. If such a housing is provided with a glazing the resulting collector will have thermal insulation properties when built as a thermal collector, properties that most parabolic concentrators lack. In such a configuration commonly available and less expensive tracking mechanisms may be used compared to those required with parabolic troughs.

Further aspects of the invention will become apparent from consideration of the drawings and the ensuing description of preferred embodiments of the invention. A person skilled in the art will realize that other embodiments of the invention are possible and that the details of the invention can be modified in a number of respects, all without departing from the inventive concept. Thus, the following drawings and description are to be regarded as illustrative in nature and not restrictive.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

DETAILED DESCRIPTION OF PREFERRED EMBODIMENTS

Preferred embodiments of the present invention and their advantages may be understood by referring to FIGS. 1a-7 wherein like reference numerals refer to like elements.

Figure 1A:
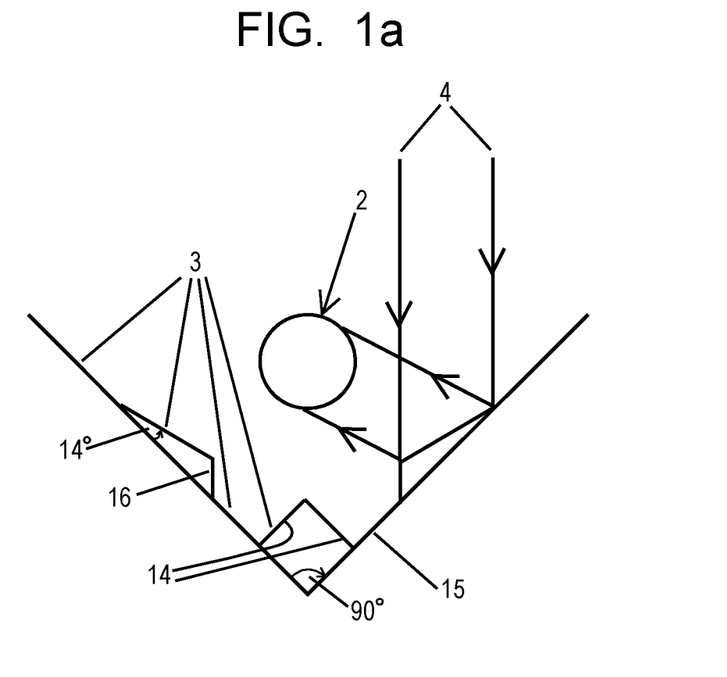
FIGS. 1a and 1b are cross-sectional drawings illustrating the theoretical concept of the present invention.
Figure 1B:
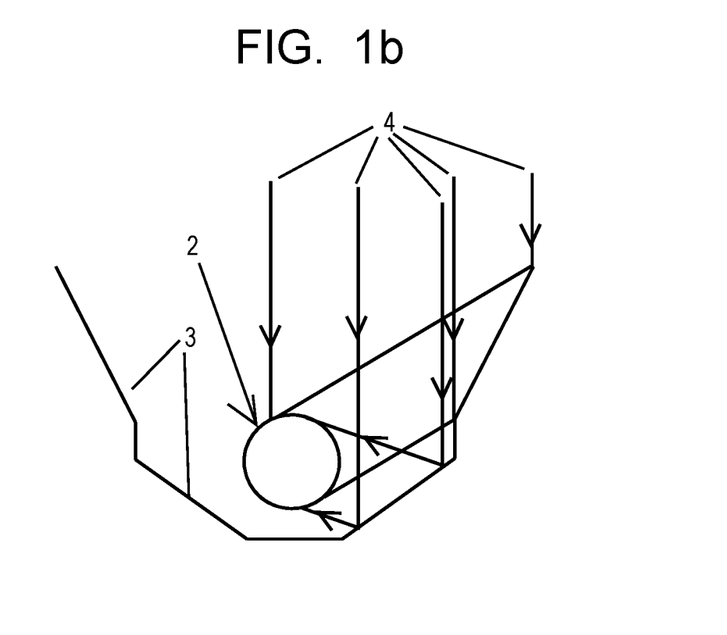

FIGS. 1a and 1b are cross-sectional representations of the basic concept of the present invention designed to illustrate the theory and operation of the invention.

Referring in detail to FIG. 1a, the V shape of the underlying support structure is illustrated by the flat planar surfaces 15. Because this support structure is flat & planar it will be able to be sourced from various off-the-shelf materials which will allow for reduction of costs compared to other trough designs that require a support structure adapted to accommodate curved mirrors or a curved underlying geometry. In the present invention Fresnel reflectors 3 are also flat which are cheaper to source or manufacture than the curved reflectors of other trough designs. Supports 16 for each individual Fresnel reflector 3 are also flat linear structures. They are oriented parallel to the central axis of the trough and the solar light rays and do not need to be reflective.

The structure with sides 14 which are also reflective would serve to add to the stability of the trough structure but is not necessary as part of the total Fresnel reflector of this design as the reflective surfaces of structure 14 could be replaced by stepped reflectors like the other ones shown in the illustrations of the invention.

By putting a solar energy receiving element 2 in the focal area along the length of the trough one preferred embodiment of the present invention a Fresnel trough solar collector is achieved. The solar energy receiving element is a structural element that is designed to receive and absorb solar energy and convert it to another type of energy. In FIG. 1a the solar energy receiving element 2 is a pipe or tube having a dark or black surface through which a fluid such as water or oil is circulated. The black surface of the pipe absorbs the solar energy and converts it to heat which is then transferred to the fluid circulating thru the pipe.

FIG. 1a shows the path of the light rays 4, shown with vector arrows, that enter the mouth of the concentrator and how they are reflected off the Fresnel steps 3 onto the receiver 2. Some of these light rays strike the receiver 2 directly from above. Further consideration of FIG. 1a shows that the angle of inclination of each reflective Fresnel step must be constructed such that the light striking it is reflected onto the receiver. The solar rays 4 and the Fresnel steps, off which they are shown reflected, illustrate that in the present invention each Fresnel reflector is at least wide enough to fully illuminate the width, profile, of the receiver 2. This feature of the present invention insures maximum efficiency and minimum cost of the Fresnel reflectors.

It is obvious from an examination of FIG. 1 that only direct solar radiation that is parallel to the trough's central axis is reflected onto the receiver and thus this concentrator, like most other trough solar concentrators, must track the sun's image across the sky in at least one direction; either in elevation, North/South, or azimuth, East/West. This illustration and all the present illustrations show the angle between the trough walls as 90 degrees but, in fact, the angle may be any angle.

FIG. 1b shows the present invention with the receiver 2 at a different position in the trough structure. This illustrates that the receiver in this invention is not restricted to any one position. In fact, the receiver may be positioned anywhere along a line representing a central axis of the trough, equal distance from the trough sides. The receiver may be positioned at the aperture opening of the trough, down inside the trough as shown in this drawing or even above the aperture opening.

Figure 2:
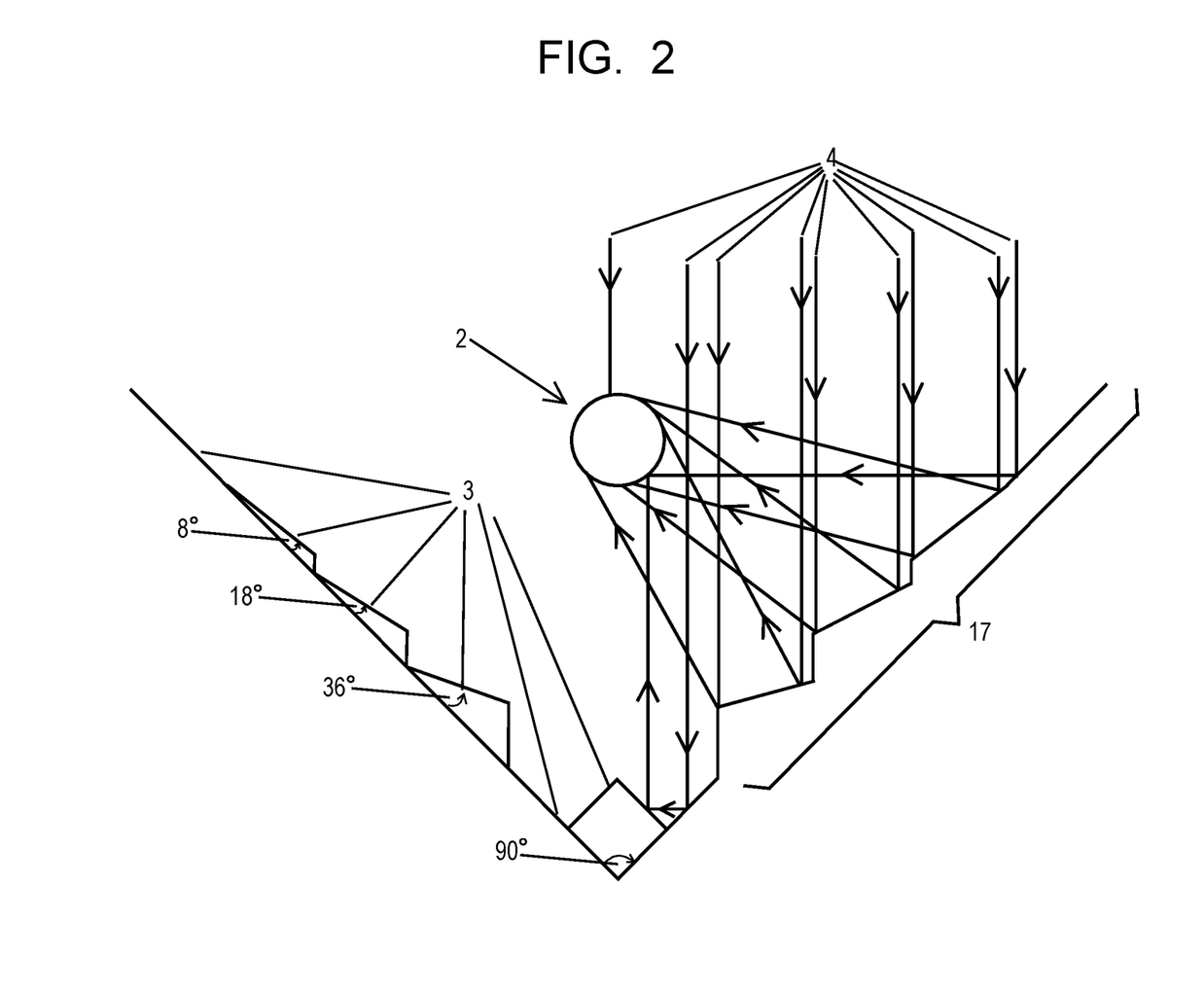
FIG. 2 shows a cross-sectional representation of the present invention with a higher concentration ratio and two different fabrication methods for the trough sides, Fresnel reflectors.

FIG. 2 shows the solar collector of this invention in a higher concentration ratio with a wider trough opening, aperture, and more reflective Fresnel steps 3. Here it can be seen that the angle of inclination of each Fresnel reflector step varies depending on its position on the trough side. When designing troughs of the present invention the angle and width of each reflector must be determined based on the trough concentration ratio, aperture width, the width of the receiver and the individual position of the reflector on the trough side.

The bracketed section 17 shows an alternative construction of the Fresnel trough reflector that lacks the underlying planar support wall. This embodiment could be achieved by stamping it from a highly reflective material of sufficient gauge. Here again, it can seen that solar radiation strikes the receiver from the reflective Fresnel steps 3 and from direct solar radiation. Also, it can be seen that the reflected radiation from each Fresnel step fully illuminates the width, profile, of the receiver.

Figure 3:
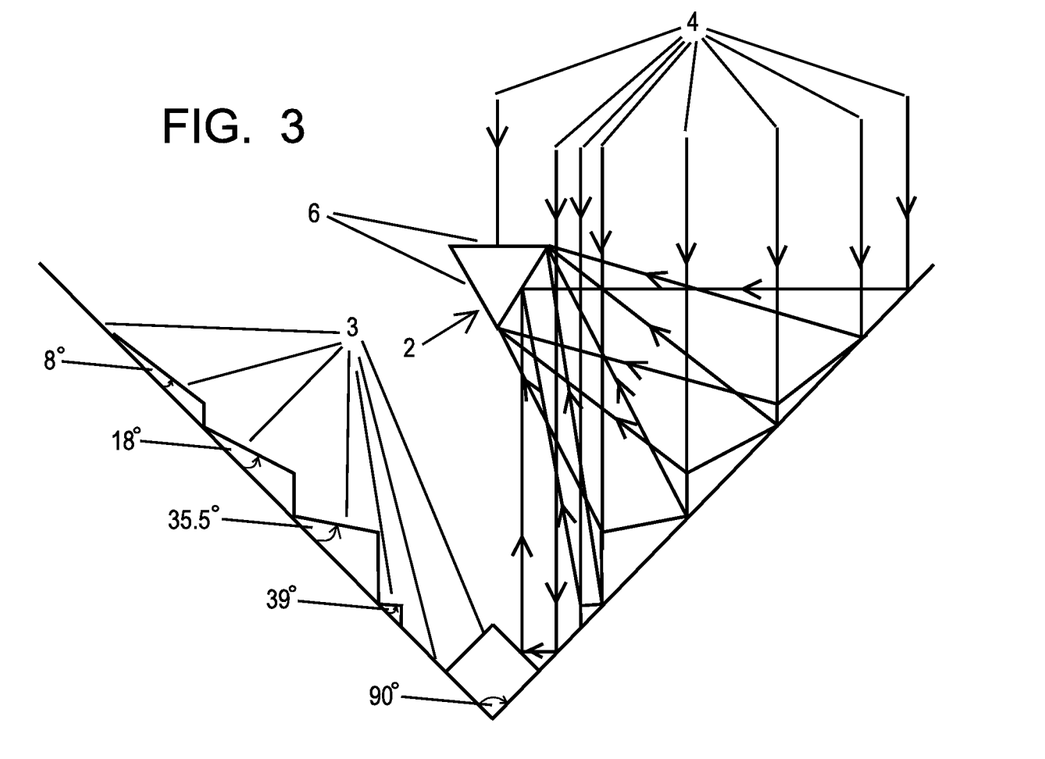
FIG. 3 shows a cross-section of the present invention with an alternate solar energy receiving element.

FIG. 3 shows the present invention in its preferred embodiment as a solar collector with a receiver having an alternative shape. The receiver illustrated here 2 has the cross-section of an equilateral triangle. This receiver 2 may be a triangular shaped tube or pipe with a black outer surface that carries a circulating fluid to be heated or it may be a triangular shaped tube that has photovoltaic solar cells 6 attached to the two underside surfaces or to all three of its outer surfaces. If configured with solar cells on the surfaces of the triangular receiver, the sunlight on the lower two surfaces facing the Fresnel reflector is concentrated by the factor of the concentration ratio of the Fresnel reflector on each side while the sunlight falling on the upper surface is direct sunlight with a concentration ratio of 1.

Figure 4:
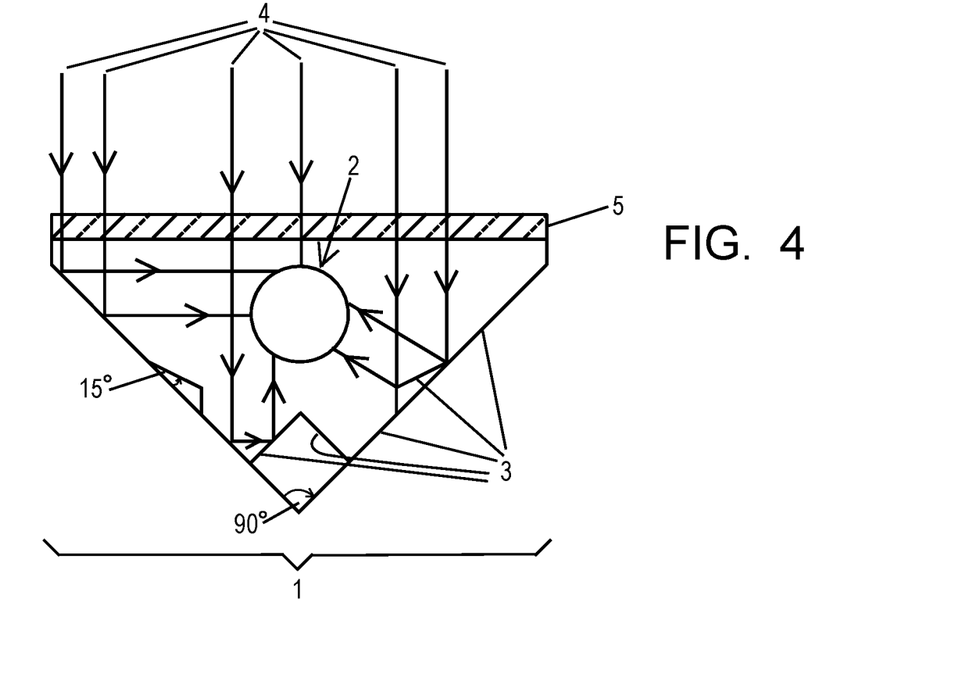
FIG. 4 shows a representation of the present invention as a solar collector with a glazing over the trough.

FIG. 4 shows the present invention as a solar collector with a glazing 5 covering the mouth of the trough structure thus enhancing the properties of one preferred embodiment of the present invention as a solar thermal collector designed to convert solar energy into heat in a fluid. The glazing 5 is a structural element that will increase the efficiency of energy conversion by providing thermal insulation retarding the convective loss of heat from the hot receiving element and by trapping the loss of energy by infrared emission from the hot receiver. The glazing 5 may be made of glass or a transparent plastic material. Alternatively, the receiver 2 could be an evacuated tube receiver thus eliminating the need for a glazing.

FIGS. 5a-5d show alternative shapes and orientations for the receiver element in the preferred embodiment as a solar collector. These alternative receiver shapes may have a heat collecting fluid circulated thru them or they may have photovoltaic solar cells attached to their outer surfaces 6. It is to be noted here that in the event solar cells are attached to these alternative receiver tubes a cooling liquid or air may be circulated thru them to cool the cells.

Figure 5A:
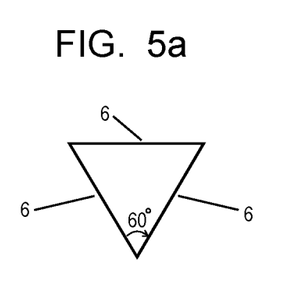
FIGS. 5a-5d show alternate embodiments of the solar energy receiving element.

FIG. 5a shows a receiver tube whose cross section is an equilateral triangle.

Figure 5B:
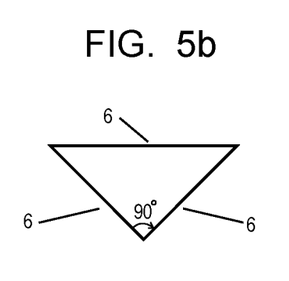

FIG. 5b shows a receiver tube whose cross section is a right triangle. This right triangle receiver tube is especially suited to match the 90-degree angle of the underlying V trough Fresnel reflector structure of the embodiments shown in this document. However, it is again to be mentioned here that the present invention is not limited to the having an underlying V trough angle of 90 degrees and that, indeed, the present invention can be made with other underlying V angles.

Figure 5C:
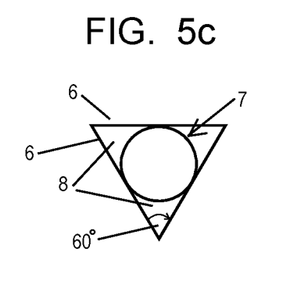

FIG. 5c shows a receiver tube whose cross section is an equilateral triangle and on whose sides 6 are mounted solar cells. Inside and concentric with the triangular tube is a round tube 7. The round tube 7 is thermally bonded to the triangular tube by a heat transfer material 8 so that a cooling fluid can be circulated thru the round tube 7 to keep the solar cells from overheating.

Figure 5D:
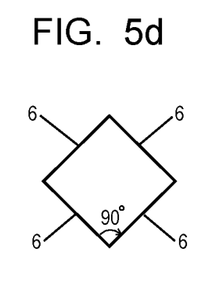

FIG. 5d shows a square tube on whose sides are mounted solar cells 6. In the present invention this receiver would be mounted with its axis from diagonally opposite corners along the trough central axis. The square tube has an economic advantage over triangular tubes in that square tubes are more easily sourced off-the-shelf.

Figure 6:
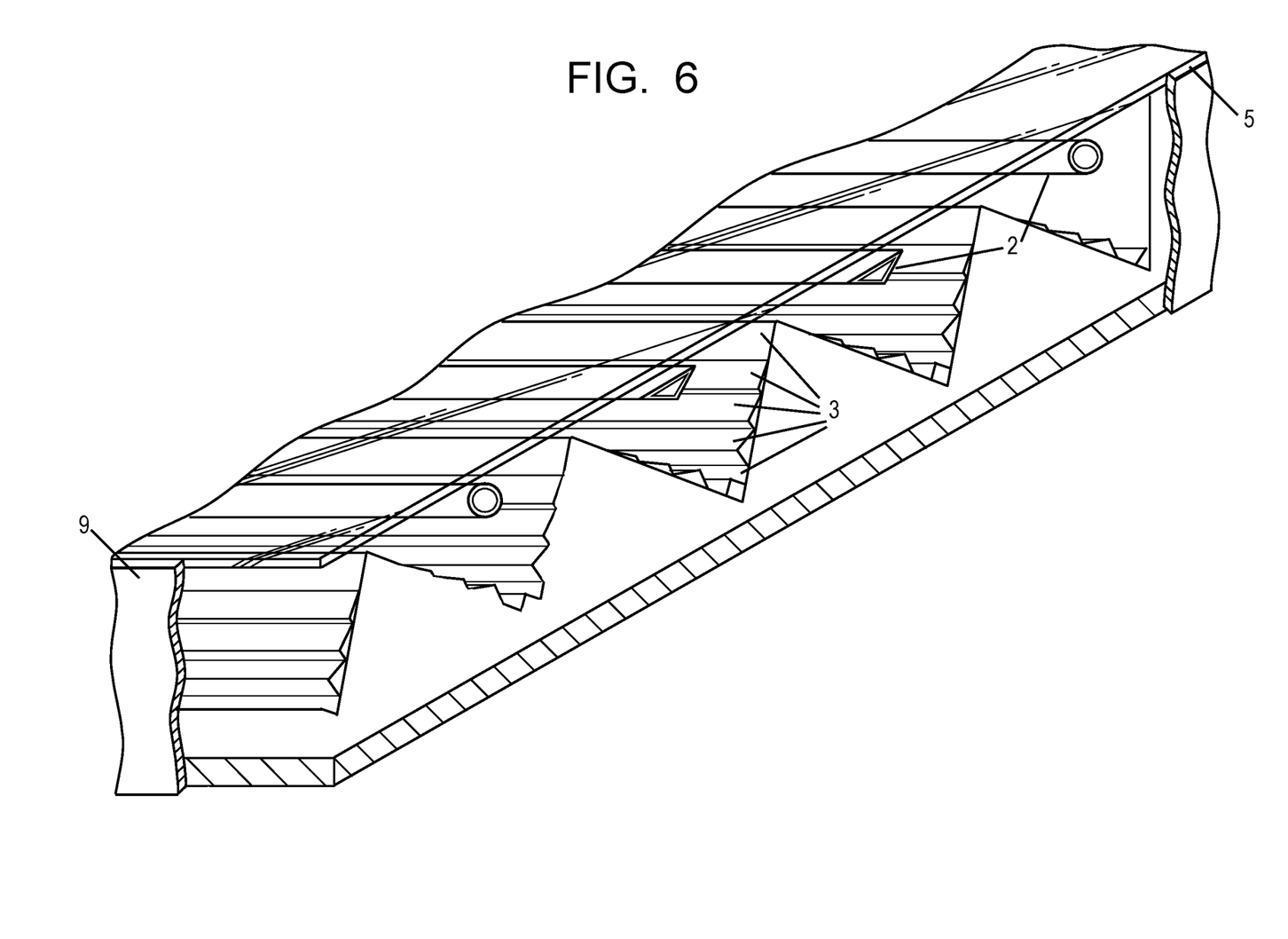
FIG. 6 is a perspective view of the present invention.

FIG. 6 shows a perspective view of the present invention in its preferred embodiment as a concentrating solar collector showing both round and triangular tube receivers 2 and 5 showing the reflective steps 3 of the Fresnel reflector. This preferred embodiment is shown in a housing 9 with a glazing 5 covering it.

Figure 7:
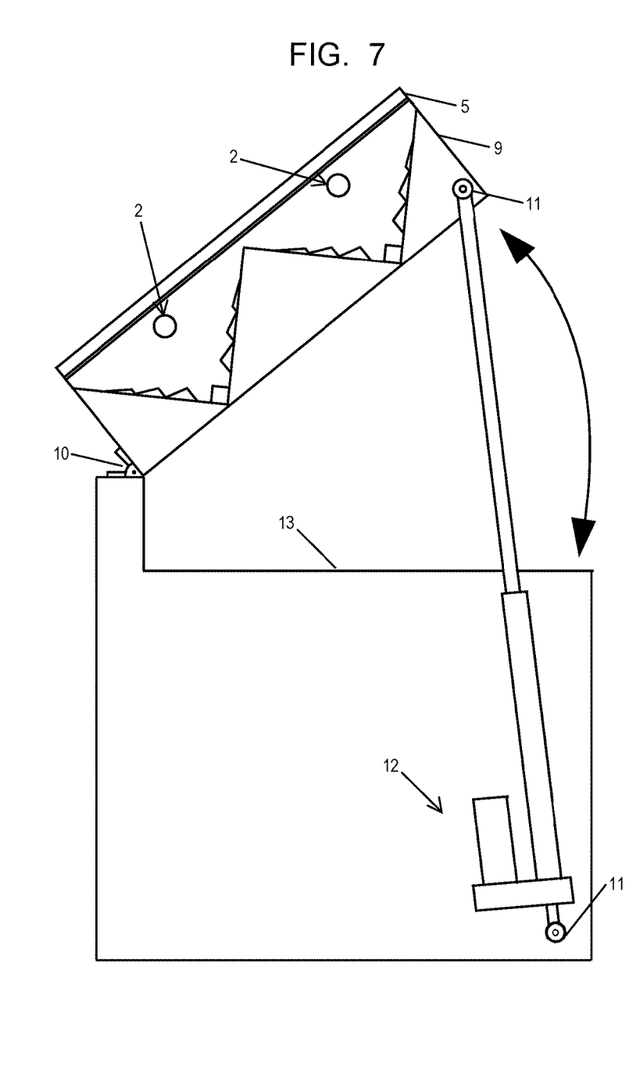
FIG. 7 is a cross-sectional representation of one possible tracking mechanism for the present invention.

FIG. 7 shows a simple and inexpensive tracking mechanism that may be used with the present invention in its' preferred embodiment as a solar collector. The tracking mechanism consists of a hinge 10 to which the collector housing 9 is mounted and on which it pivots allowing the collector to track the suns motion across the sky in the vertical, North/South, direction. The hinge 10 is also mounted to a base 13 allowing for the needed angle of rotation for the desired hours of solar energy collection. The rotation of the collector is accomplished by a linear actuator 12 which extends and retracts to pivot the collector on the hinge 10. Pivots 11 where the linear actuator attaches to the collector housing 9 and the base 13 allow for the pivoting motion of the collector and the angular motion of the linear actuator that is required to accomplish the tracking of the collector.

The linear actuator in this tracking mechanism must be controlled by a solar aiming device, not here shown, that tracks the vertical motion of the sun across the sky and provides a signal to the linear actuator telling it in which direction to move the collector and how far, thus keeping the axis of the Fresnel concentrator of the present invention pointed at the sun. Solar aiming devices of this type are readily available off-the-shelf devices.

The tracking mechanism herein described is presented for illustrative purposes only and is not the subject of this invention. Other tracking mechanisms commonly known to the state of the art may be used with the present invention.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

I claim:

1. A solar concentrator comprising:
   a. a V-shaped support structure having a first side and a second side that oppose, and are mirror images of, one another, wherein a slope extending from a lowermost edge to an uppermost edge of the first side and the second side, respectively, is constant;
   b. a solar tracking device;
   c. a plurality of support members extending from the support structure, said support members being disposed parallel to a central axis of the concentrator, wherein the solar tracking device directs movement of the concentrator such that incoming solar radiation is always parallel to each of the support members;
   d. a plurality of plane reflectors, wherein each reflector is connected to at least one support member, wherein the reflectors are collectively arranged in a stepped architecture along the support structure; and
   e. a solar energy receiving element disposed at a central focal area of the concentrator, the central focal area being disposed upon the central axis of the concentrator, wherein the receiving element has a circular cross-section,
   wherein the reflectors reflect and concentrate the incoming solar radiation to the central focal area, wherein each reflector illuminates an entire width of the receiving element, as measured across a face of the cross-section of the receiving element, the cross-section being oriented perpendicular to a longitudinal axis of the receiving element, wherein the receiving element converts the concentrated solar radiation to another form of energy.

2. The solar concentrator of claim 1, wherein, when the support structure is in an upright position, the receiving element is positioned lower than the uppermost edge of the support structure.

3. The solar concentrator of claim 1, wherein, when the support structure is in an upright position, the receiving element is positioned higher than the uppermost edge of the support structure.

4. The solar concentrator of claim 1, wherein, when the support structure is in an upright position, the receiving element is positioned at the same height as the uppermost edge of the support structure.

5. The solar concentrator of claim 1, wherein the receiving element comprises a fluid, wherein the fluid is circulated through the receiving element, wherein the concentrated solar radiation is absorbed by the receiving element and converted to heat energy that is transferred to the fluid circulating through the receiving element.

6. The solar concentrator of claim 1, wherein the receiving element comprises photovoltaic cells positioned along the width of the receiving element, wherein the photovoltaic cells convert the concentrated solar radiation into electrical energy.

7. The solar concentrator of claim 6, wherein the receiving element comprises a fluid, wherein the fluid is circulated through the receiving element to cool the photovoltaic cells and harvest thermal energy.

* * * * *